United States Patent
Hsu et al.

(10) Patent No.: US 7,050,304 B2
(45) Date of Patent: May 23, 2006

(54) HEAT SINK STRUCTURE WITH EMBEDDED ELECTRONIC COMPONENTS FOR SEMICONDUCTOR PACKAGE

(75) Inventors: Shih-Ping Hsu, Hsin-chu (TW); Lin-Yin Wong, Hsin-chu (TW)

(73) Assignee: Phoenix Precision Technology Corporation, (TW)

( * ) Notice: Subject to any disclaimer, the term of this patent is extended or adjusted under 35 U.S.C. 154(b) by 0 days.

(21) Appl. No.: 10/772,042

(22) Filed: Feb. 3, 2004

(65) Prior Publication Data

US 2005/0047094 A1  Mar. 3, 2005

(30) Foreign Application Priority Data

Aug. 28, 2003  (TW) .............................. 92123709 A

(51) Int. Cl.
*H05K 7/20* (2006.01)
(52) U.S. Cl. ...................... 361/719; 361/704; 257/706; 257/712; 165/80.3; 165/185
(58) Field of Classification Search ........ 361/704–710, 361/715–721, 742, 760; 257/704, 706, 707, 257/710, 712, 713, 717–719; 165/80.3, 185; 174/252
See application file for complete search history.

(56) References Cited

U.S. PATENT DOCUMENTS

| | | | | |
|---|---|---|---|---|
| 4,933,808 A * | 6/1990 | Horton et al. | ............... | 361/715 |
| 5,371,404 A * | 12/1994 | Juskey et al. | ............... | 257/659 |
| 5,623,394 A * | 4/1997 | Sherif et al. | ................ | 361/705 |
| 5,819,402 A * | 10/1998 | Edwards et al. | .............. | 29/840 |
| 5,907,474 A * | 5/1999 | Dolbear | ...................... | 361/705 |
| 5,982,038 A * | 11/1999 | Toy et al. | ................... | 257/772 |
| 6,081,037 A * | 6/2000 | Lee et al. | .................... | 257/778 |
| 6,281,573 B1 * | 8/2001 | Atwood et al. | ............. | 257/706 |
| 6,437,240 B1 * | 8/2002 | Smith | ........................ | 174/52.2 |

* cited by examiner

*Primary Examiner*—Boris Chervinsky
(74) *Attorney, Agent, or Firm*—Fulbright & Jaworski LLP

(57) ABSTRACT

A heat sink structure with embedded electronic components is proposed, wherein a plurality of recessed cavities are formed on a heat sink for embedding the electronic components and receiving at least one semiconductor chip therein. This arrangement enhances electric performance of a semiconductor package with the above heat sink structure and improves heat dissipating efficiency of the semiconductor package.

4 Claims, 4 Drawing Sheets

HEAT SINK STRUCTURE WITH EMBEDDED ELECTRONIC COMPONENTS FOR SEMICONDUCTOR PACKAGE

FIELD OF THE INVENTION

The present invention relates to heat sink structures with embedded electronic components for semiconductor packages, and more particularly, to an integrated structure of a heat sink and electronic components, which can significantly improve electric performance and heat dissipation efficiency of a semiconductor package with such an integrated structure.

BACKGROUND OF THE INVENTION

BGA (Ball Grid Array) is an advanced type of integrated circuit packaging technology which is characterized in mounting at least one semiconductor chip on a front surface of a substrate and implanting an array of solder balls on a back surface of the substrate. The solder balls act as input/output (I/O) connections to electrically connect the chip to an external device such as printed circuit board (PCB). The BGA configuration advantageously allows relatively more solder balls or I/O connections to be accommodated on a unit area of the substrate in accordance with high integration of the chip.

Following the rapid advances in electronic technology, electronic devices are developed towards multiple functionality and high performance. To achieve high integration and miniaturization of a semiconductor package, a single-layer circuit board is improved to be a multi-layer circuit board with interlayer connections for mounting more active/passive components and circuits.

Passive components such as resistors, capacitors and inductors are usually incorporated in the semiconductor package to enhance or stabilize the electric performance of electronic devices. For example, the resistor is used to adjust the current, the capacitor is used to temporarily store the voltage, to provide a filtering function, or to reduce noise in circuitry, and the inductor can filter noises out.

Referring to FIG. 7, U.S. Pat. No. 6,108,212 discloses a semiconductor package having a substrate 21 incorporated with conductive pads 21 and electrodes 22, wherein an electrically resistive volume 23 is formed between a conductive pad 21 and an electrode 22, such that the substrate 20 is electrically connected to an external electronic device 25 via metallic bumps 24 mounted on the conductive pads 21, and a set of conductive pad 21, electrode 22 and electrically resistive volume 23 function as a passive component to improve electric performance of the semiconductor package. However, such an integral substrate has complex structure to be fabricated and thus is cost-ineffective in manufacture; moreover, the substrate needs to be re-designed if different property values such as resistance value and capacitance value are required, which would significantly increase the manufacturing and material costs.

In addition, electronic components and electronic circuits are packed in high density in the semiconductor package and thus produce a huge amount of heat. If the heat cannot be timely dissipated in an efficient way, the performance and lifetime of the semiconductor package would be damaged by overheat. Furthermore, the semiconductor package generally lacks a shielding mechanism and is easily interfered by external electromagnetic waves and noises.

Therefore, the problem to be solved herein is to provide a semiconductor package incorporated with sufficient electronic components such as active/passive components and semiconductor chips, which can improve the electric performance, effectively dissipate heat and provide shielding for the semiconductor package.

SUMMARY OF THE INVENTION

In accordance with the foregoing drawbacks of the prior art, a primary objective of the present invention is to provide a heat sink structure with embedded electronic components for a semiconductor package, which can improve heat dissipation, eliminate electromagnetic interference and enhance electric performance of a semiconductor package with the heat sink structure.

Another objective of the invention is to provide a heat sink structure with embedded electronic components for a semiconductor package so as to enhance the flexibility of routability or circuit layout on a substrate of a semiconductor package with the heat sink structure.

A further objective of the invention is to provide a heat sink structure with embedded electronic components for a semiconductor package so as not to complicate the manufacturing processes and to increase the fabrication cost.

In order to achieve foregoing and other objectives, the present invention proposes a heat sink structure with embedded electronic components comprising a heat sink formed with a plurality of recessed cavities for embedding the electronic components and receiving at least one semiconductor chip therein. The heat sink with at least one embedded electronic component can be attached to a substrate mounted with at least one semiconductor chip to form a semiconductor package, wherein the at least one semiconductor chip is received in at least one of the recessed cavities. Besides improving the heat dissipating efficiency, the heat sink with the electronic component can enhance electric performance of the semiconductor package and provides a shielding effect to protect the semiconductor chip against external electromagnetic interference.

The electronic component embedded in the heat sink can be an active or passive component. The passive component may be for example a capacitor, resistor, inductor or chip-type passive component. Moreover, since the active/passive component is embedded and the semiconductor chip of the semiconductor package is received in the recessed cavities of the heat sink, this arrangement does not need to require the complex manufacturing processes for integrating a passive component in the conventional semiconductor package substrate and would not increase the fabrication cost unlike the case of the prior art to re-design the conventional substrate to achieve desirable electric performance. As a result, in the use of the heat sink structure according to the present invention, routability or circuit layout on the substrate can be improved.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFFERED EMBODIMENTS

Preferred embodiments of a heat sink structure and a semiconductor package with the heat sink structure proposed by the present invention are described in detail with reference to FIGS. 1 to 6.

Figure 1:
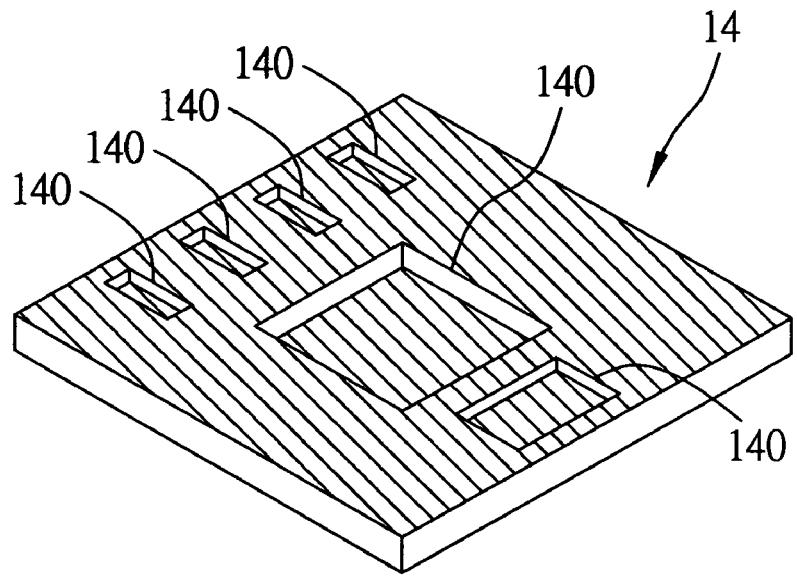
FIG. 1 is a perspective view of a heat sink structure according to a first preferred embodiment of the present invention.
Figure 2:
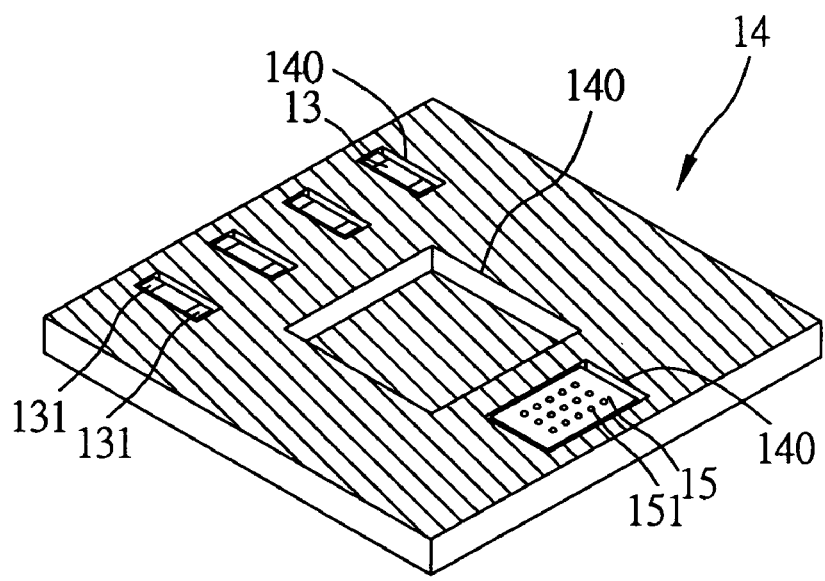
FIG. 2 is a perspective view of the heat sink structure of FIG. 1 with embedded electronic components.

FIGS. 1 and 2 show the heat sink structure in accordance with a first preferred embodiment of the invention.

As shown in FIG. 1, the heat sink structure includes a heat sink 14 made of a highly conductive and rigid material such as metal, preferably copper. The heat sink 14 has an upper surface and a lower surface, with a plurality of recessed cavities 140 formed on the lower surface of the heat sink 14 for accommodating electronic components. The electronic components can be passive or active components, wherein the passive components include capacitors, resistors, inductors or chip-type passive components.

As shown in FIG. 2, at least one passive component 13 such as capacitor, resistor or inductor is embedded in at least one of the recessed cavities 140 of the heat sink 14. The passive component 13 can be formed in the recessed cavity 140 via conventional coating technique such as screen-printing or by sintering a ceramic passive component material under a high temperature in the recessed cavity 140; alternatively, the passive component 13 can be adhered via an adhesive in the recessed cavity 140, wherein electrodes 131 are formed on a surface of the passive component 13. At least one chip-type passive component 15 with a plurality of electrodes 151 formed on a surface thereof may also be embedded in at least one of the recessed cavities 140 of the heat sink 14. The passive components 13, 15 are conventional and not to be further described herein. It should be understood that besides the passive components 13, 15, other electronic components such as active components (not shown) can also be accommodated in the recessed cavities 140 of the heat sink 14.

Figure 3:
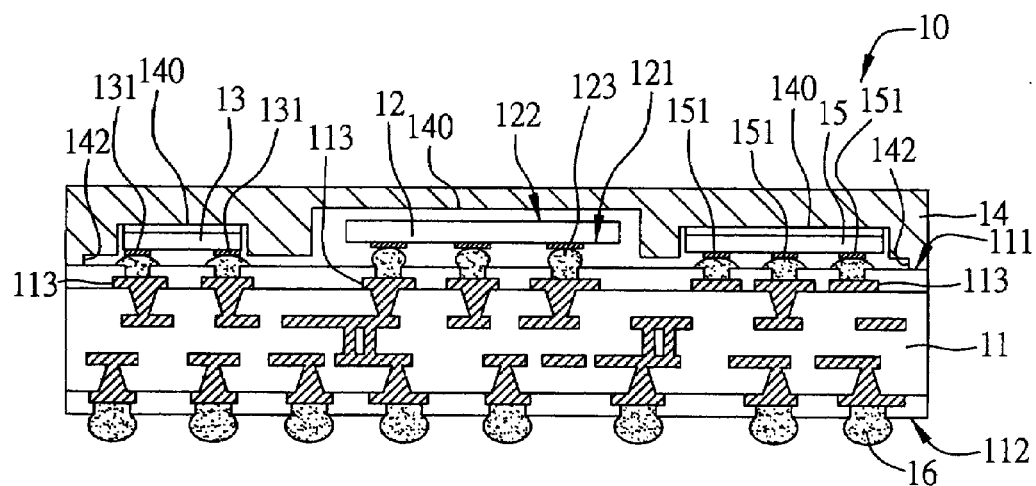
FIG. 3 is a cross-sectional view of a semiconductor package in the use of the heat sink structure with embedded electronic components according to the first preferred embodiment of the invention.

FIG. 3 shows a semiconductor package in the use of the heat sink structure with embedded electronic components according to the first embodiment.

As shown in FIG. 3, the semiconductor package 10 comprises a substrate 11 having a first surface 111 and a second surface 112, with at least one semiconductor chip 12 mounted in a flip-chip package technique on the first surface 111 and electrically connected to electrical connection pads 113 on the first surface 111 of the substrate 11; and the heat sink 14 having the recessed cavities 140 formed on the lower surface thereof, wherein the recessed cavities 140 includes those embedded with the passive components 13, 15 and at least one corresponding in position to the chip 12. When the lower surface of the heat sink 14 is attached to the first surface 111 of the substrate 11, the passive components 13, 15 embedded in the recessed cavities 140 of the heat sink 14 are electrically connected via their electrodes 131, 151 to the electrical connection pads 113 on the substrate 11, and the chip 12 mounted on the substrate 11 is received in the corresponding recessed cavity 140 of the heat sink 14. Besides, a resin compound such as epoxy resin (not shown) may be filled in the space between the heat sink 14 and the substrate 11 to alleviate thermal stresses generated by CTE (thermal expansion coefficient) mismatch between the heat sink 14 and the substrate 11. In order to avoid resin flash over the periphery of the substrate 11, a continuous protruded portion 142 can be formed on the periphery of the lower surface of the heat sink 14 to prevent the overflow of the encapsulating resin from occurrence. A plurality of conductive elements 16 are mounted on the second surface 112 of the substrate 11, which are used to electrically connect the semiconductor package 10 to external devices (not shown).

The substrate 11 can be a circuit board with two-layer circuits or multi-layer circuits, which is formed by providing a core substrate with a first conductive metal layer and patterning the first conductive metal layer to form a first circuit layer, and performing a build-up process to form an insulating layer and then a second conductive metal layer which is patterned subsequently to form a second circuit layer. These processes can be repeated according to the practical requirement to fabricate a substrate with multi-layer circuits. The core substrate or insulating layer is made of an insulating organic material such as epoxy resin, polyimide, cyanate ester, glass fiber, bismaleimide triazine (BT) or a mixture of epoxy resin and glass fiber, or a ceramic material. The circuit layer is generally made of a highly conductive material such as copper to serve as a conductive media for transmitting signals in the substrate. The insulating layer is further formed with a plurality of conductive vias for electrically connecting adjacent circuit layers. Fabrication of the substrate 11 can also be achieved by conventional lamination and build-up technology which is well known in the art and not to be further described here.

The semiconductor chip 12 has a circuit surface 121 and a non-circuit surface 122. On the circuit surface 121 of the chip 12, there are formed a plurality of metallic bumps 123 for mounting the chip 12 in a flip-chip package technique and electrically connecting the chip 12 to the electrical connection pads 113 on the first surface 111 of the substrate 11. Alternatively, it should be understood that besides the flip-chip package technique, the semiconductor chip may also be attached via its non-circuit surface to the substrate and electrically connected to the substrate via conventional wire-bonding technique.

The heat sink 14 with the embedded passive components 13, 15 is incorporated in the semiconductor package 10 and thus improves the electric performance of the semiconductor package 10. Since the heat sink 14 is made of a highly conductive metal such as copper, the heat sink 14 mounted on the substrate 11 with the chip 12 received in the corresponding recessed cavity 140 can effectively dissipate heat from operation of the chip 12 and also provide a shielding effect for the chip 12 to protect the chip 12 against external electromagnetic interference.

The conductive elements 16 such as solder balls or conductive pillars (not shown) are implanted to the second surface 112 of the substrate 11 via a ball-implanting process, which are used to electrically connect the chip 12 to an external device such as printed circuit board.

Figure 4:
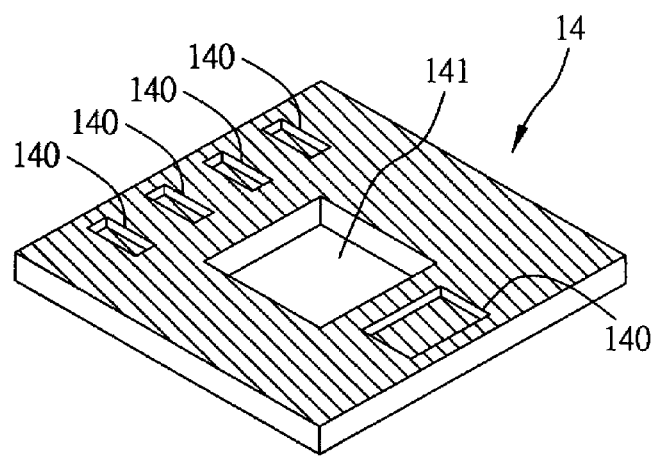
FIG. 4 is a perspective view of a heat sink structure according to a second preferred embodiment of the invention.
Figure 5:
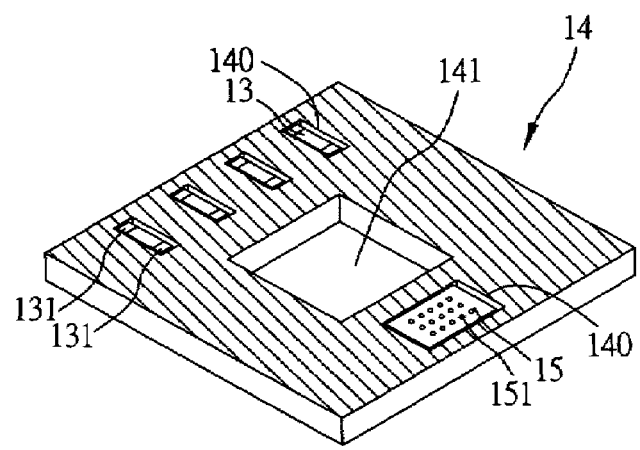
FIG. 5 is a perspective view of the heat sink structure of FIG. 4 with embedded electronic components.

FIGS. 4 and 5 show a heat sink structure in accordance with a second preferred embodiment of the invention.

As shown in the drawings, the heat sink 14 of the second embodiment is substantially the same as that of the first embodiment, but only differs in that in this embodiment at least one through hole 141 is formed through the heat sink 14 at a position for receiving the semiconductor chip (not shown).

Figure 6:
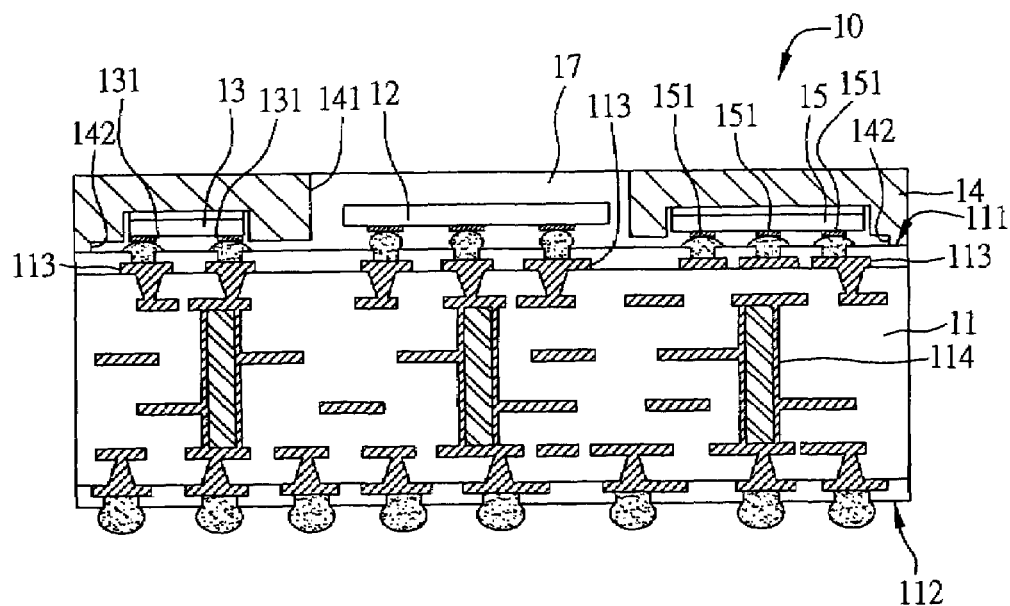
FIG. 6 is a cross-sectional view of a semiconductor package in the use of the heat sink structure with embedded electronic components according to the second preferred embodiment of the invention.
Figure 7:
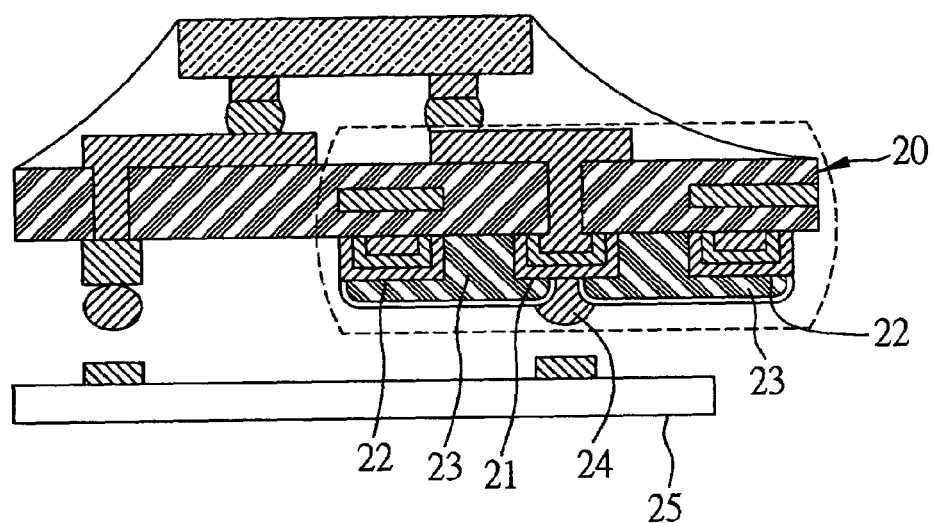
FIG. 7 (PRIOR ART) is a cross-sectional view of a conventional semiconductor package having a substrate incorporated with passive components.

FIG. 6 shows a semiconductor package in the use of the heat sink structure with embedded electronic components according to the second embodiment.

As shown in FIG. 6, the semiconductor package 10 of the second embodiment is substantially the same as that of the first embodiment, but only differs in that in this embodiment the at least one semiconductor chip 12 mounted on the first surface 111 of the substrate 11 is received in the at least one through hole 141 of the heat sink 14. A molding process is performed to fill a resin compound such as epoxy resin in the through hole 141 and the space between the heat sink 14 and the substrate 11 to form an encapsulation body 17 that encapsulates and protects the chip 12 against damage from external moisture or contaminant. The encapsulation body 17 also helps alleviate the thermal stresses generated by CTE mismatch between the heat sink 14 and the substrate 11. Moreover, the substrate 11 is formed with a plurality of plated through holes (PTHs) 114 for electrically connecting different circuit layers therein. Preferably a continuous protruded portion 142 may be formed at the periphery of the lower surface of the heat sink 14 to prevent overflow or flash of the resin compound from occurrence.

In the use of the heat sink structure according to the invention, at least one semiconductor chip and a heat sink embedded with active or passive components (such as capacitor, resistor, inductor, or chip-type passive component) can be integrated together in a semiconductor package so as to improve the electric performance and heat dissipation efficiency for the semiconductor package at the same time. The heat sink integrated with the semiconductor chip not only effectively dissipates heat from operation of the chip but also provides a shielding effect for the chip. As a result, the use of the heat sink structure according to the present invention is advantageous in not requiring complex manufacturing processes for integrating a passive component in the conventional substrate, and also not increasing the fabrication cost unlike the case of the prior art to re-design the conventional substrate to achieve desirable electric performances. Therefore, the present invention enhances the flexibility of routability or circuit layout on the substrate.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package with a heat sink structure with embedded electronic components, comprising:
    a substrate having a first surface and a second surface, the first surface being formed with a plurality of electrical connection pads thereon;
    at least one semiconductor chip mounted on and electrically connected to the first surface of the substrate;
    a heat sink having an upper surface and a lower surface, with the lower surface attached to the first surface of the substrate and formed with a plurality of recessed cavities thereon, allowing at least one electronic component with a plurality of electrodes to be embedded in at least one of the recessed cavities, wherein the lower surface of the heat sink is attached to the first surface of the substrate via the electrodes of the embedded electronic component electrically connected to the electrical connection pads on the substrate, and at least one through hole is formed through the first surface and the second surface of the heat sink to receive the at least one semiconductor chip
    a resin compound filled in a space between the heat sink and the substrate; and
    a plurality of conductive elements mounted on the second surface of the substrate for electrically connecting the semiconductor package to an external device.

2. The semiconductor package of claim 1, wherein a continuous protruded portion is formed at the periphery on the lower surface of the heat sink.

3. The semiconductor package of claim 1, wherein the electronic component is an active or passive component.

4. The semiconductor package of claim 1, wherein the heat sink is made of a highly conductive and rigid material.

* * * * *